United States Patent [19]

Kahn

[11] 4,433,312

[45] Feb. 21, 1984

[54] METHOD AND MEANS FOR MODULATING WAVES

[76] Inventor: Leonard R. Kahn, 137 E. 36 St. (Apt. 6A), New York, N.Y. 10016

[21] Appl. No.: 332,018

[22] Filed: Dec. 18, 1981

[51] Int. Cl.³ .......................... H03C 1/50; H03C 1/52; H03C 5/00
[52] U.S. Cl. .................................. 332/22; 332/23 R; 332/29 R; 332/41; 332/44; 332/48; 332/52; 332/17
[58] Field of Search ...................... 332/17, 41, 44, 48, 332/52, 22, 23 R, 29 R; 455/46, 102, 108, 109

[56] References Cited

U.S. PATENT DOCUMENTS

| | | | |
|---|---|---|---|
| 2,624,041 | 12/1952 | Evans, Jr. | 332/23 |
| 3,170,127 | 2/1965 | Cramer | 332/41 |
| 3,260,964 | 7/1966 | Whitehead et al. | 332/21 |
| 4,028,641 | 6/1977 | Bodtmann et al. | 332/18 |

*Primary Examiner*—John S. Heyman
*Assistant Examiner*—Nicholas Biase

[57] ABSTRACT

An improved high efficiency amplitude modulation system comprising three power amplifier paths, each incorporating high efficiency type amplifiers.

One path amplifies an unmodulated carrier wave and the other two amplify phase modulated waves preferably generated by the disclosed improved Armstrong phase modulator.

16 Claims, 7 Drawing Figures

BLOCK DIAGRAM
OF PRIOR ART CHIREIX
AMPLITUDE MODULATOR

BLOCK DIAGRAM
OF PRIOR ART ARMSTRONG
PHASE MODULATOR

METHOD AND MEANS FOR MODULATING WAVES

BACKGROUND OF THE INVENTION

One of the oldest problems of communications engineering is how to efficiently produce double-sideband amplitude modulated waves and other envelope modulated waves Numerous amplitude modulation systems have been proposed and a large variety of such systems are in current use, including plate or collector modulation, forms of pulse width modulation, Doherty modulation, and Chireix modulation.

Chireix modulation, although a very modern appearing system, was originally disclosed by its French inventor in the early 1930s. The Chireix system, shown in block form in FIG. 1, is discussed in more detail below where improvements on this ingenious system are disclosed.

It is noteworthy that an early publication describing the Chireix system ("High Power Outphasing Modulation", H. Chireix, November 1935, PIRE, pgs. 1370 to 1392) discussed the use of another basic invention. That basic invention was a method for producing phase modulated waves combining an unmodulated wave (carrier wave) and an ". . . almost entirely modulated wave"; i.e., wherein the carrier is almost entirely suppressed such as produced by a balanced modulator, said almost entirely modulated wave is 90 degrees out-of-phase with the unmodulated wave. This technique was also used by E. H. Armstrong in his early FM experiments and is generally called the Armstrong modulator. The basic Armstrong modulator is shown in FIG. 2.

With the advent of transistors, and the common usage of very high frequencies, the need for new improved high efficiency systems for producing envelope modulated waves has become more pressing. The efficiency of a conventional high frequency transistorized linear amplifier, above 800 MHz, is very poor. Many commercial linear amplifiers for operation at 800 to 1,000 MHz have efficiencies of significantly less than 10%.

Attempts have been made to provide an improved linear amplifier (D. C. Cox, "Linear Amplification with Nonlinear Components", IEEE Transactions on Communications, Vol. COM-22, pp. 1942-1945, December 1974) by combining the Chireix system with the Envelope Elimination and Restoration (EER) system, see L. R. Kahn, "Single-Sideband Transmission by Envelope Elimination and Restoration", PIRE, Vol. 40, No. 7, July 1952, pgs. 803-806 and L. R. Kahn, "Comparison of Linear Single-Sideband Transmitters with Envelope Elimination and Restoration Single-Sideband Transmitters", PIRE, Vol. 44, No. 12, December 1956, pgs. 1706-1712. Mr. Cox remarked in the first sentence of his December 1974 publication:

> "Conventional solid-state linear power amplifiers are difficult to build at low microwave frequencies and impossible to build at high microwave and millimeter wave frequencies."

A tutorial paper that discusses approaches to high efficiency envelope modulation systems is, "High Efficiency Amplification Techniques", Dr. F. H. Raab, IEEE Circuits & Systems (Newsletter), 7, pp. 3-11, December 1975. This paper includes treatments of the Chireix systems, and the EER system, as well as a number of other high efficiency systems.

Finally, an excellent treatment of the Chireix system, including suitable combining networks, is contained in the book Radio Engineering, E. K. Sandeman, Chapman & Hall Ltd., London, Second Edition, 1953, Chapter XIV.

SUMMARY OF THE INVENTION

It is an object of the present invention to efficiently produce amplitude modulated waves.

A further object of the invention is to provide amplitude modulators not only suitable for use at low carrier frequencies but capable of providing good operation at gigahertz frequencies.

A still further object is to improve the performance of Armstrong modulators. These phase modulators can be used to improve the performance of the basic Chireix type modulation system.

One main embodiment of the invention utilizes the following method steps to produce an envelope modulated wave by use of three signal paths each path utilizing nonlinear, high efficiency amplifiers:

(a) generating an unmodulated carrier wave,
(b) feeding said unmodulated carrier wave to one of the three signal paths,
(c) phase modulating a portion of the carrier wave generated in step (a) carrier wave to produce a first phase modulated wave,
(d) feeding said first phase modulated wave to a second signal path,
(e) phase modulating another portion of the carrier wave generated in step (a) to produce a second phase modulated wave,
(f) feeding said second phase modulated wave to the third signal path, and,
(g) combining the output signals of the three paths to produce the desired envelope modulated wave.

The invention may be used to produce hybrid modulated waves having both envelope modulation and angular modulation components, such as Compatible Single-Sideband waves, but in such cases the (a) step produces a reference wave which is an angular modulated wave.

If this embodiment of the invention is used to produce a conventional double-sideband full carrier wave, the path amplifying the unmodulated carrier should, for a 100% sine wave modulated signal, produce two thirds of the power in the output load and the two paths amplifying phase modulated waves should equally share in producing the other one-third of the output power.

This invention preferably utilizes a special form of Armstrong phase modulator which produces an arc sine function of the audio input. The special circuits disclosed for providing the arc sine function can also be used in two path systems such as the Chireix system. The improved Armstrong type phase modulator preferably would incorporate a nonlinear circuit which, when fed by a modulating signal, produces a wave suitable for controlling the amplitude of the carrier or reference angular modulated wave so that the sum of the carrier or reference wave and a wave generated by a balanced modulator would have a substantially constant envelope. Said balanced modulator would have its signal port connected to the modulating signal and its carrier port connected to the carrier or reference wave which is in quadrature with the amplitude controlled carrier or reference wave. The non-linear circuit in one embodiment of the invention utilizes squaring means which squares the modulated signal and also includes a difference circuit connected to the output of the squaring means and which subtracts the output of the squaring means from a dc voltage. The output of the difference circuit would feed a square root type circuit to produce an output suitable for controlling the amplitude of the carrier or reference wave so that the phase modulator produces a relatively constant amplitude wave.

The three path embodiment of the invention is especially suitable for producing waves which may be demodulated by envelope detectors; for example, conventional double-sideband full carrier waves or Compatible Single-Sideband (CSSB) waves.

For a better understanding of the present invention, together with other and further objects, reference is made to the following description, in conjunction with the accompanying drawings, and its scope will be pointed out in the appended claims.

DESCRIPTION OF THE PREFERRED EMBODIMENTS

As mentioned above, FIGS. 1 and 2 are respectively block drawings of the prior art Chireix modulation system and the prior art Armstrong phase modulation system.

Figure 3:
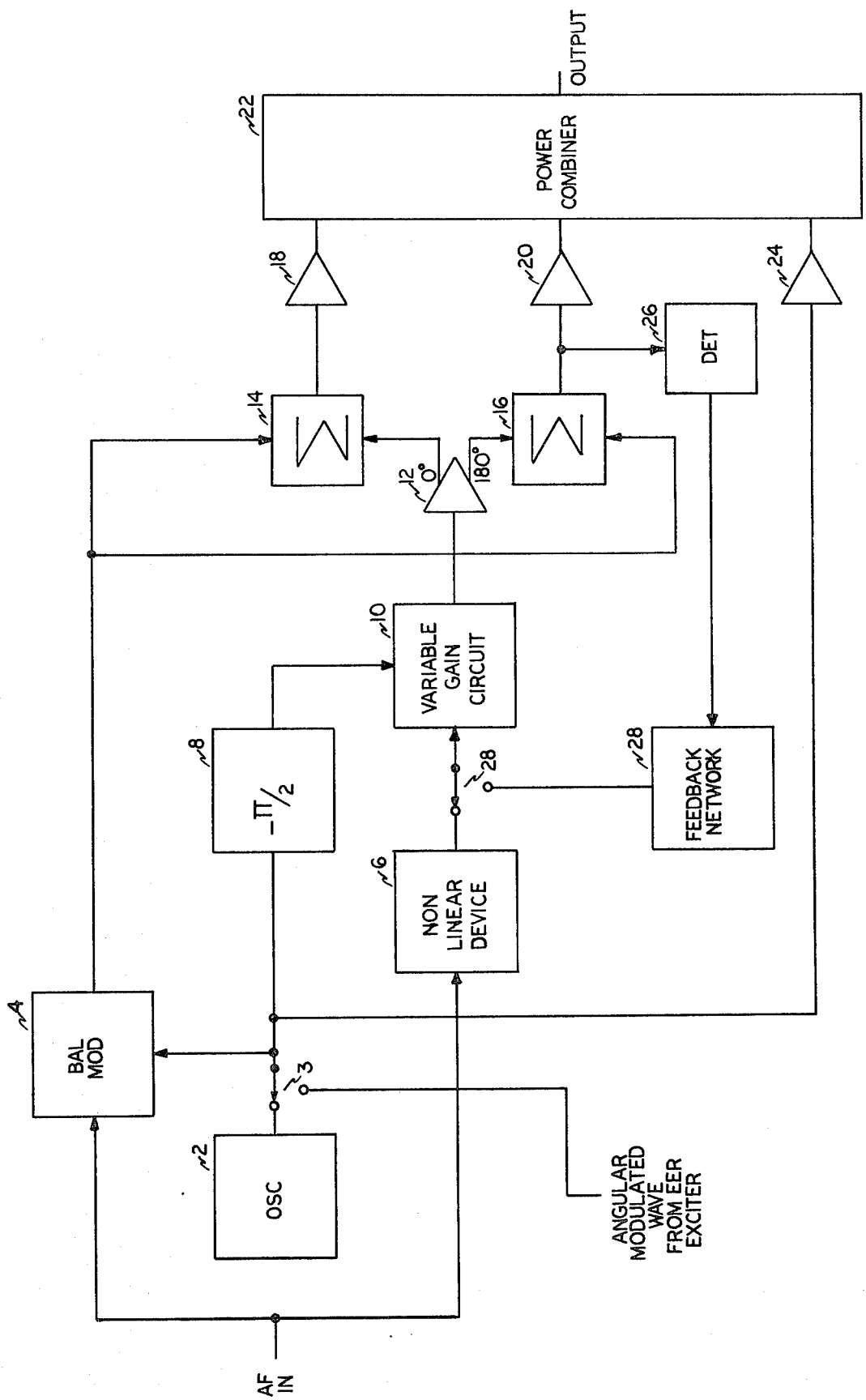
FIG. 3 is a block diagram of a preferred embodiment of the three path system claimed herein.

FIG. 3 is an overall block diagram of a preferred embodiment of the instant invention. An audio frequency wave or other type of modulating wave is fed to balanced modulator 4. Also fed to balanced modulator 4 is a carrier wave generated in oscillator 2 operating at the desired carrier frequency and passed through switch 3.

It will be recognized that it is possible to operate oscillator 2 at an intermediate frequency and incorporate frequency converters later in the system, for example, as part of amplifiers 18, 20 and 24. Alternatively, if the invention is to be used to produce hybrid modulated waves, such as SSB full, reduced or suppressed carrier waves and Compatible Single-Sideband waves, in accordance with U.S. Pat. Nos. 2,666,133, 2,989,707, 3,212,008 and 3,952,251 the wave fed to balanced modulator 4 would be an angular modulated wave. Angular modulated waves are constant amplitude waves and include both frequency modulated and phase modulated waves. In such service, switch 3 is switched so that an external source of angular modulated waves, say from an envelope elimination and restoration (EER) exciter, for example, from block 17 of FIG. 5 of U.S. Pat. No. 2,666,133 (incorporated herein by reference) feeds balanced modulator 2 and phase shifter circuit 8.

The output of balanced modulator 4 is a double-sideband suppressed carrier wave. The carrier wave (or alternatively angular modulated wave) is also fed through a phase shift network 8 which causes this signal to be rotated −90 degrees so that the carrier wave fed to block 10 is in quadrature with the phase sum of the sideband components produced by balanced modulator 4. This quadrature carrier wave (or angular modulated wave) is passed through variable gain circuit 10, which alternatively may be a variable loss circuit which produces a variable amplitude wave which is subsequentially amplified by amplifier 12. A diode type balanced modulator circuit may be used for block 10. An IC, such as the Motorola MC1596L, also can be used for block 10.

Amplifier 12 has two outputs equal in amplitude but 180 degrees out-of-phase. The 0° output is fed to summation circuit 14 and the 180 degree output feeds summation circuit 16.

Figure 2:
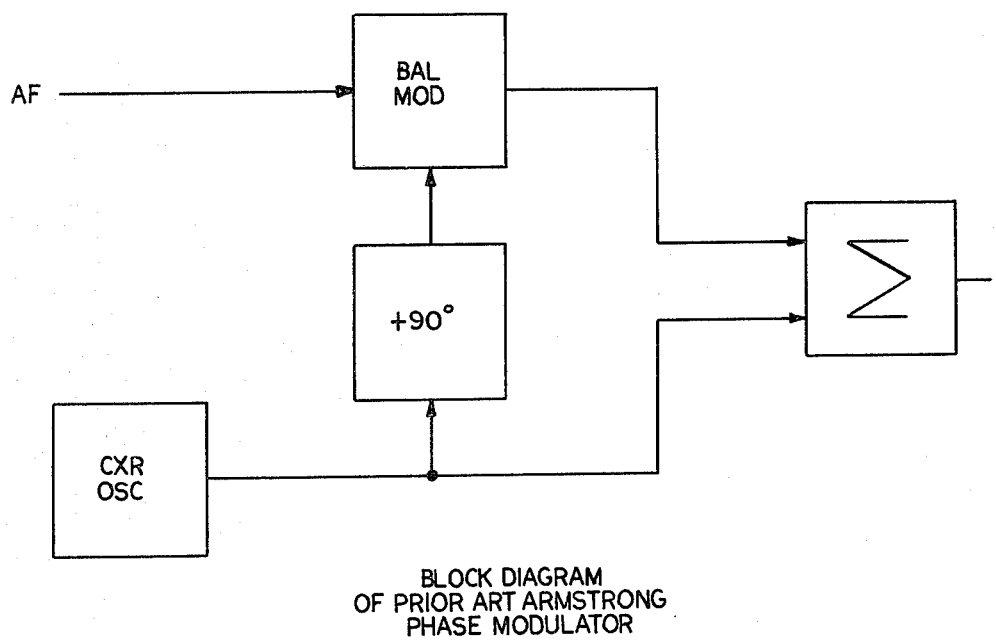
FIG. 2 is a block diagram of the prior art Armstrong phase modulator.

One will recognize, by comparing Blocks 2, 4, 8, 12 and 14 (disregarding block 10) with FIG. 2, that this section of FIG. 3 comprises an Armstrong modulator and produces phase modulated waves. Similarly, blocks 2, 4, 8, 12 and 16 comprise a second phase modulated wave generator. It is important to note that the carrier of the phase modulated wave produced at the output of summation circuit 16 is 180 degrees out-of-phase with the carrier of the phase modulated wave produced at the output of summation circuit 14.

The outputs of summation circuits 14 and 16 are amplified in amplifier 18 and 20. One of the basic advantages of this invention is that the waves at the outputs of summation circuits 14 and 16 are relatively constant in amplitude. Accordingly, amplifiers 18 and 20, and any frequency translators incorporated in these amplification claims, need not be linear devices. Therefore, the amplifiers used can, for example, be high efficiency nonlinear Class C or Class D amplifiers.

The output of amplifiers 18 and 20 are combined in power combiner 22.

Absent modulation, the combined outputs produced by these two phase modulation generators will be nulled out. With modulation, the combined outputs produce a double-sideband suppressed carrier wave.

Figure 1:
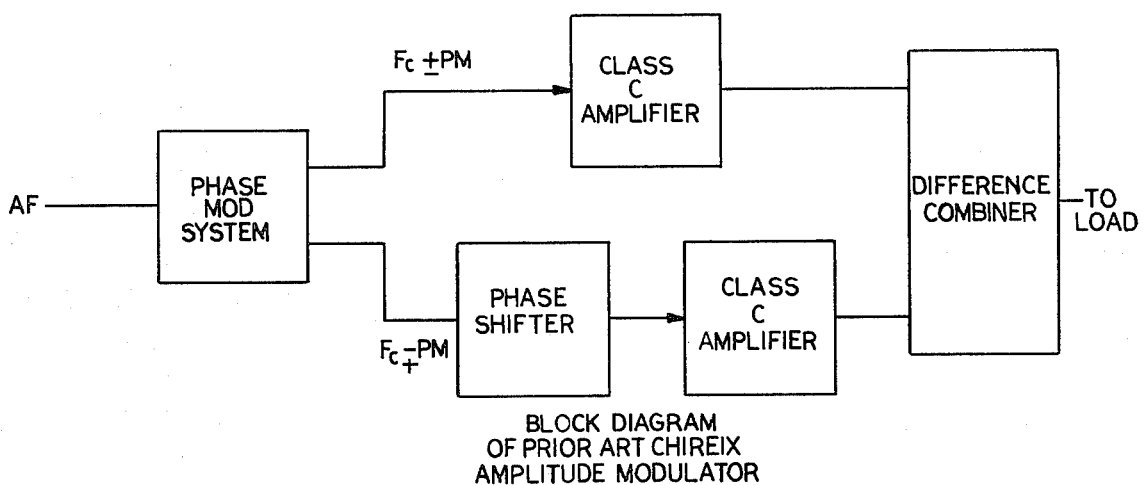
FIG. 1 is a block diagram of the prior art Chireix type amplitude modulator.

The portion of the instant amplifying system, producing the two phase modulation waves just described, is a form of Chireix type amplifier, as shown in FIG. 1, except that the angular difference between the two signal paths is different. The relative phase of the two PM paths, when the input modulation signal is absent, is, as mentioned above, 180 degrees, whereas for a conventional Chireix system the two paths are set for approximately 135 degrees differential so that rather than producing a double-sideband suppressed carrier wave, as in the instant invention, a double-sideband full carrier amplitude modulated wave results.

There is a third input to power combiner 22 and this is the amplified unmodulated carrier wave which is the output of amplifier 24. This additional component produces an amplitude modulated wave complete with carrier. (If the three path system is used, in a CSSB transmitter, for example, following the teachings of U.S. Pat. No. 3,952,251 in conjunction with the teachings of U.S. Pat. No. 2,666,133, what has been described above as a carrier wave might best be termed a reference wave and it would be the angular modulation component of the CSSB wave.) Thus, amplifiers 18 and 20 produce a double-sideband suppressed carrier wave and amplifier 24 provides the carrier component so as to produce a full carrier double-sideband wave. However, this overall system would produce, absent nonlinear circuit 8 or feedback circuits 26 and 28, a wave having appreciable envelope distortion.

In order to achieve the desirable low distortion characteristic, the quadrature carrier of the output of phase shift network 8 must be varied in amplitude or other means must be supplied so as to produce phase modulated waves having an arc sine relationship to the audio input signals.

In this preferred embodiment of the invention, in distinction with conventional negative feedback techniques, only the amplitude of the quadrature carrier or reference wave is caused to vary in amplitude in order to reduce phase modulation distortion. Since the carrier or reference waves in the two amplifying paths are 180 degrees out-of-phase the additional sideband components caused by the amplitude modulation of their quadrature carrier or reference waves tend to cancel out (as does the quadrature carrier or reference waves) when the output from these two amplifying paths are combined. Thus, the only carrier component that reaches the output load is that which is amplified by the third amplifier.

Figure 4:
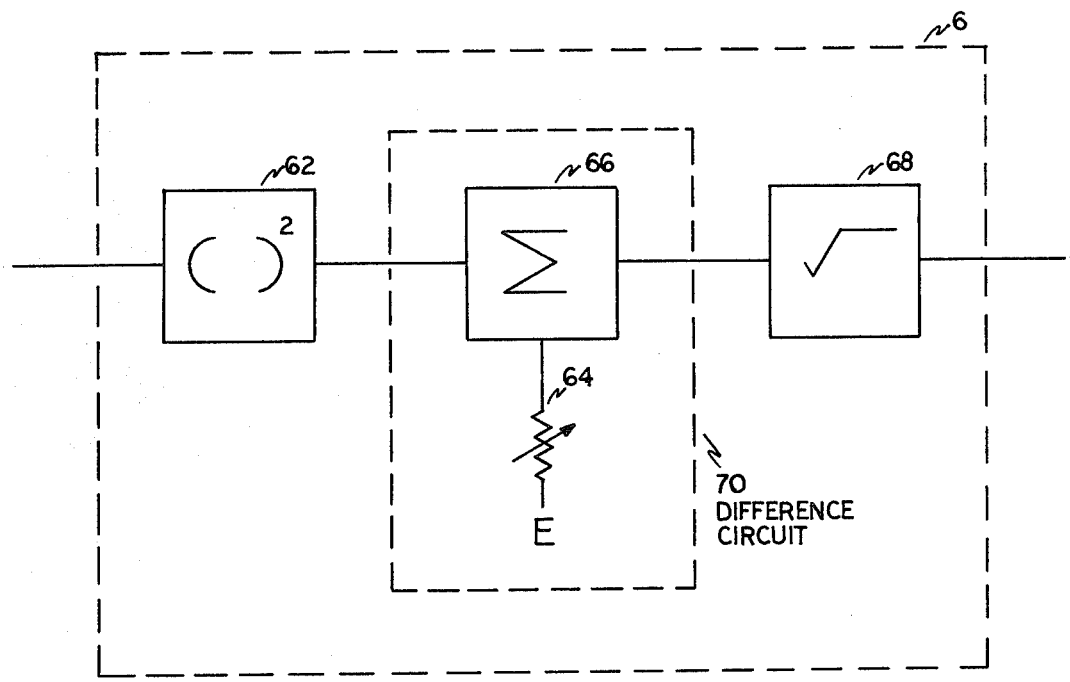
FIG. 4 is a block/schematic drawing of details of block 6 of FIG. 3.

FIG. 4 shows the detailed structure of one possible non-linear device of the type suitable for use in block 6 of FIG. 3.

This circuitry alters the waveshape of the audio wave fed to block 6 so as to produce a waveshape suitable for varying the amplitude of the quadrature carrier component of the Armstrong phase modulator in such a manner as to cause the summation of the output of balanced modulator 4 and the outputs of amplifier 10 to be essentially constant in amplitude. It should be noted that the fundamental frequency of this wave for sine wave inputs is two times the frequency of the input signal and that for 100% modulation where the phase modulation circuit produces ±90° the wave shape is that of a full wave rectifier; i.e. $|\sin wt|$. This wave shape will be described in more detail in conjunction with the description of FIG. 7. It is noteworthy that unlike the conventional Armstrong modulator it is possible to produce phase modulation of up to ±90° whereas the Armstrong modulator theoretically can only approach ±90° when the sidebands become infinite in amplitude.

Since the resultant of the carrier and the quadrature sidebands is constant there is an arc sine relationship between the output angle and the audio input. Prior efforts to produce this function include use of overall negative feedback as reported in the November 1975 IEEE Transactions on Communications, pg. 1281, "Component Signal Separation and Recombination for Linear Amplification with Nonlinear Components", by D. C. Cox and R. P. Leck. The combined outputs which appear at the outputs of blocks 14 and 16 are subsequently amplified in Class C amplifiers 18 and 20. These amplifiers are not capable of faithfully amplifying envelope modulation. Therefore, it is necessary that the waves at the outputs of blocks 14 and 16 be essentially constant amplitude waves.

There are a number of different types of circuits that may be used to provide the squaring action of block 62. One device which performs quite satisfactorily in this system is the MC1594L integrated circuit as manufactured by Motorola Corporation of Phoenix, Ariz. This monolythic four quadrant multiplier can be connected to act as a squaring circuit when used with an operational amplifier, such as a TL081CP as manufactured by Texas Instruments of Dallas, Tex., or with Motorola MC1556G.

The output of the squaring circuit is fed to a subtraction circuit 70 wherein a dc voltage from a source voltage E fed through variable resistor 64 is combined with said output in summation circuit 66 which comprises a TL081 op amp circuit connected as a unity gain summation circuit. The relative polarity of the dc voltage E is such as to cause a subtraction of voltage making the entire circuit 64 and 66 act as a subtraction circuit. The output of the subtraction circuit 70 feeds a square root circuit 68. This circuit can also utilize a four quadrant multiplier MC1594L and an operational amplifier such as a TL081 device.

Circuits for both the squaring and square root circuits are shown, for example, in the Motorola Linear Integrated Circuit Amplifier book, 3rd Edition, dated November 1973, pages 8-394 and 8-396. While these circuits provide good performance, those skilled in the art will recognize that there are a number of alternative circuits available for providing the three basic functions of block 6; i.e., squaring, subtracting, and square rooting.

Furthermore, other nonlinear devices can be designed to achieve the overall effect of block 6 without performing the discrete steps indicated.

Also, it is possible to program a microprocessor to cause the output of an analog to digital (A to D) converter fed by the audio wave and provide the desired nonlinear characteristic. The resulting digital wave can then be converted back to analog form by a D to A converter and the resulting wave used to control variable gain circuit 10.

It will also be apparent to one skilled in the art that a combination of the nonlinear circuit 6 of FIG. 3 plus a feedback circuit comprising blocks 26 and 28 can be used concurrently. By this procedure, overall improved performance can be achieved. It is also feasible to solely use the feedback circuit comprising blocks 26 and 28 so as to reduce the amplitude of the carrier wave combined with the output of the double-sideband suppressed carrier modulator.

Also, it is possible to use a conventional overall negative feedback system such as disclosed by Cox and Leck in their November 1975 IEEE Transactions on Communications paper, in conjunction with the methods of the instant invention to further improve performance.

The nonlinear circuit of FIG. 4 and/or the feedback circuit comprising blocks 26, 28 and 10 can also be used to improve the performance of the conventional Chireix type amplifiers shown in FIG. 1.

Figure 5:
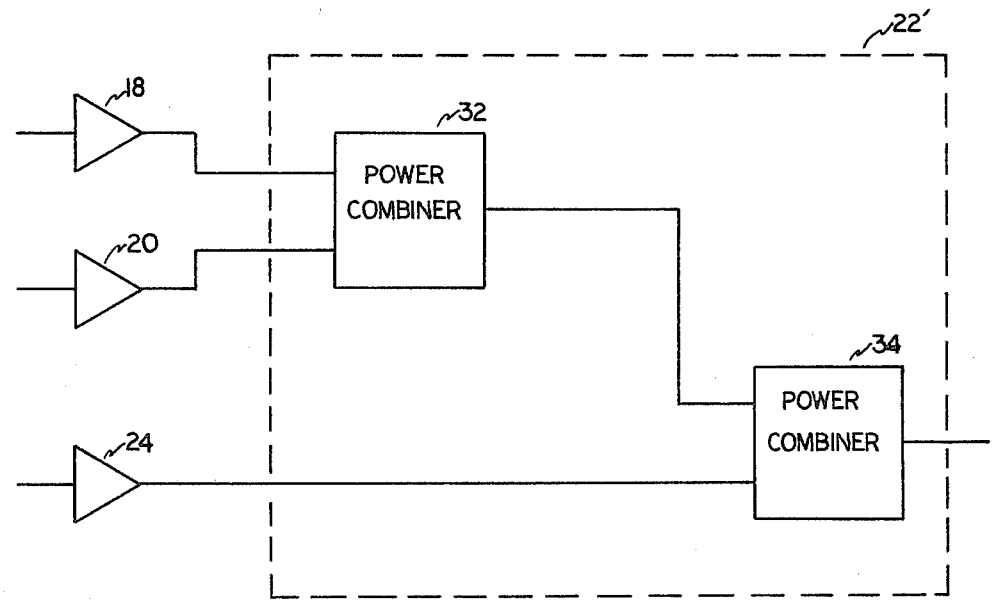
FIG. 5 shows details of one embodiment of block 22 of FIG. 3. This embodiment is especially useful where amplifiers 18, 20 and 24 are critical to mismatch.

FIG. 5 shows the details of one type of power combiner, block 22 of FIG. 3. This Combiner 22' is fed by amplifiers 18, 20 and 24 and is especially useful if these amplifiers are sensitive to impedance mismatch. Certain type transistor amplifiers are particularly intolerant of mismatch and may become unstable, emitting spurious radiation when facing mismatched loads. Indeed, some transistors may fail under such conditions.

The outputs of amplifiers 18 and 20 are summated in power combiner A, block 32. Power combiners are available commercially and comprise a hybrid type circuit and a balancing resistor. If the amplifiers 18 and 20 can tolerate some degree of mismatch it is possible to eliminate the balancing resistor reducing power loss. Suitable power combiners, for moderate power levels at frequencies from 100 to 1,500 MHz are available, for example, from Technical Research and Manufacturing, Inc., Manchester, N. H. One such power combiner, D-201, uses a coaxial system whereas others use microstrip circuits.

The output of power combiner 32 feeds one input port of power combiner 34. The other input port to power combiner 34 is connected to the output circuit of amplifier 24. The output of power combiner 34 feeds the output load of the system.

It should be noted that use of these power combiners causes power loss. The loss is 3 db in each of the power combiners plus some loss, generally in the order of 1 db, due to imperfections in the power combiners. (As mentioned above, if the amplifiers used are tolerant of mismatch it is possible to substantially reduce power loss by deleting the balancing resistors in power combiners 32 and/or 34.)

Therefore, power from amplifiers 18 and 20 can suffer approximately 8 db loss and power from amplifier 24, 4 db loss. This loss, of course, is undesirable and reduces the overall system efficiency. If amplifiers are used, that are not critical to mismatch, then a more efficient system may be used as shown in FIG. 6.

Figure 6:
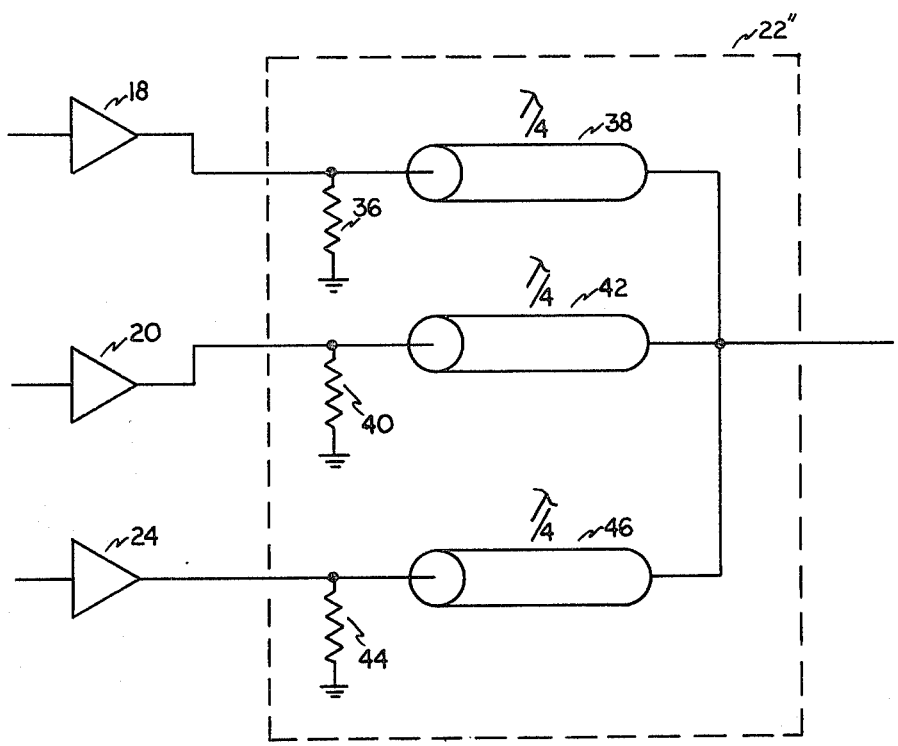
FIG. 6 shows details of a second type of block 22 of FIG. 3 for use where amplifiers 18, 20 and 24 are not critical to mismatch and where highest efficiency is required. Quarter wave lines are shown in the drawing but other type impedance inverters may be used.

The overall system, as shown in the dotted box 22'' of FIG. 6, serves the same function as 22' of FIG. 3 and that is to combine the outputs of amplifiers 18, 20 and 24.

The output of each amplifier is passed through a quarter wave line, the outputs of which are tied together. The outputs are then either fed to the output load directly or may be impedance transformed if necessary and then passed to the output load.

The quarter wave lines 38, 42 and 46 may be lengths of cable or can be lumped circuit networks, for example, lowpass filter $\pi$ networks, especially when low operating frequencies are used. Resistors 36, 40 and 44 may not be necessary if the amplifiers are very insensitive to impedance mismatch. The purpose of these resistors is to avoid the amplifiers working into extremely high load impedances which are produced when the resultant wave, that appears in the combined output terminal of lines 38, 42 and 46, approaches zero voltage. This will occur when the resulting envelope modulation causes the instantaneous amplitude of the envelope to approach zero.

At this instant, lines 38, 42 and 46 "see" a zero impedance condition because, while currents are flowing, the resultant of the three currents from the lines reaches a null condition. As is well known, a quarter wave line, when its output is shorted, reflects theoretically an infinite impedance and since such power amplifiers do not function properly, under open circuit conditions, resistors 36, 40 and 44 limit the magnitude of the load impedance faced by the amplifiers.

Figure 7:
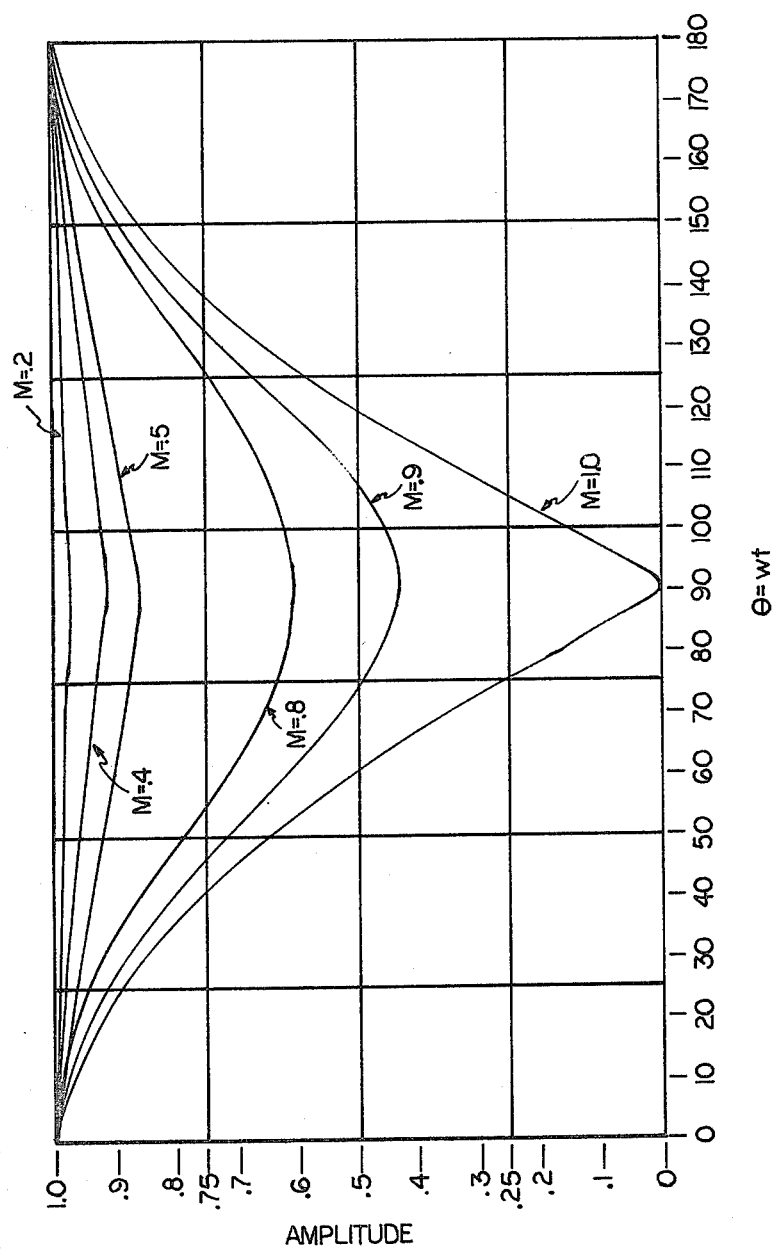
FIG. 7 shows the waveshape of the output of block 6 of FIG. 3 with sine wave inputs of varying levels.

In adjusting the circuitry, shown in FIG. 4, it is useful to know what waveshapes are to be expected at the output of the nonlinear system comprising blocks 62, 70 and 68. FIG. 7 is a graph showing the waveshapes of the envelope of the wave at the output of block 6 of FIG. 3 (the output of block 68 of FIG. 4) for sinewave input modulating signals of different amplitudes. It is noteworthy that the amount of envelope modulation decreases rapidly as the input level decreases. For example, the maximum downward modulation, which occurs at 90°, is only 1−0.866=0.134 at 50% overall system envelope modulation. In comparison, at 100% overall system envelope modulation, the modulation of the output of block is complete; i.e., the envelope is reduced to zero at the 90° point.

It is also noteworthy that the waveshape at the output of block 6 during 100% sinewave modulation is the well known |sin wt| shape. This is the same envelope shape of a double-sideband suppressed wave when modulated by a sinewave. Actually, this fact offers proof as to the correctness of this procedure in that the sum of the output of balanced modulator 4 and amplifier 14 has a constant envelope because of the trigometric identity;

$$\sqrt{|\sin wt|^2 + |\cos wt|^2} = 1$$

Thus, by modifying an Armstrong type phase modulator so as to cause the amplitude of the quadrature carrier component to be a function of the input modulating signal, a constant envelope wave results. Furthermore, this produces an arc sine function relationship between output phase and input modulating signal.

While there has been described what is believed to be the preferred embodiment of the invention, those skilled in the art will recognize that other and further modifications may be made thereto without departing from the spirit of the invention and it is intended to claim all such embodiments as fall within the true scope of the invention.

What is claimed is:

1. The method of producing an envelope modulated wave by use of three signal amplifiers comprising the following steps:
    (a) generating an unmodulated carrier wave,
    (b) amplifying said unmodulated carrier wave in a first signal amplifier,
    (c) phase modulating a portion of the carrier wave generated in step (a) with an input signal to produce a first phase modulated wave,
    (d) amplifying said first phase modulated wave in a second signal amplifier,
    (e) phase modulating another portion of the carrier wave generated in step (a) with the input signal to produce a second phase modulated wave,
    (f) amplifying said second phase modulated wave in a third signal amplifier, and,
    (g) combining the amplified waves resulting from steps (b), (d) and (f) to produce the desired envelope modulated wave.

2. The method of claim 1 wherein the carrier of the phase modulated wave amplified in step (d) is in quadrature with the unmodulated carrier wave amplified in step (b) and the carrier of the phase modulated wave amplified in step (f) is 180 degrees out-of-phase with the carrier of the phase modulated wave amplified in step (d).

3. The method of envelope modulating an angular modulated wave so as to produce a hybrid modulated wave comprising the following steps:
    (a) amplifying said angular modulated wave in a first signal amplifier,
    (b) phase modulating a portion of the angular modulated wave with an input signal to produce a first further modulated wave,
    (c) amplifying said first further modulated wave in a second signal amplifier, (d) phase modulating another portion of the angular modulated wave with the input signal to produce a second further modulated wave, (e) amplifying said second further modulated wave in a third signal amplifier, and, (f) combining the amplified waves resulting from steps (a), (c) and (e) to produce the desired hybrid modulated wave.

4. The method of claim 3 wherein the angular modulated wave is the angular modulation component of a Compatible SSB wave and said input signal is the envelope component of the Compatible SSB wave.

5. A device for producing envelope modulated waves the envelope being essentially a linear function of an input signal wave comprising;

means for generating an unmodulated carrier wave, a first path for amplifying the unmodulated carrier wave, means for generating a first phase modulated wave having a carrier component essentially in quadrature with the carrier wave amplified in the first path, and said phase modulation being a function of said input signal, a second path for amplifying said first phase modulated wave, means for generating a second phase modulated wave having a carrier component which is essentially 180 degrees out-of-phase with the carrier component of the first phase modulated wave and essentially the same function of said input signal wave, as the first phase modulated wave, a third path for amplifying said second phase modulated wave, and, means for combining the outputs of the three paths and feeding the resulting envelope modulated wave to an utilization device.

6. The device of claim 5 wherein at least one amplifier used in each of the three paths is a high efficiency type nonlinear amplifier.

7. The device of claim 5 wherein the means for generating the first and second phase modulated waves are Armstrong type modulators incorporating means for varying only the amplitude of the quadrature component wave so as to produce a phase modulation closely approximating an arc sine function of said input signal wave.

8. The device of claim 5 wherein the path amplifying the unmodulated wave produces, under 100% sinusoidal modulation conditions two-thirds of the output power and the total power from the two other paths produces the remaining one-third of the power.

9. An Armstrong type phase modulator wherein a double-sideband suppressed carrier wave is added to a quadrature carrier, comprising a carrier wave source, an input signal source, means for producing the double-sideband suppressed carrier signal from the carrier wave and the input signal, and means for causing the carrier to be in quadrature with the suppressed carrier wave, the improvement being providing means for reducing the amplitude of the quadrature carrier component as a function of the input signal so as to cause the resultant wave's angular displacement from its unmodulated phase to approximate an arc sine function of said input signal.

10. The Armstrong modulator of claim 9 wherein the amplitude of the quadrature carrier is reduced from its unmodulated condition by a factor equal to:

$$\sqrt{1 - (e(t))^2}$$

where $e(t)$ is a normalized function of said input signal.

11. The Armstrong modulator of claim 9 wherein the said means for reducing the amplitude of the quadrature carrier comprises;

(a) means for squaring the signal from said source of input signal audio wave which feeds, (b) means for subtracting the output of the squaring means from a dc voltage which in turn feeds, (c) means for square-rooting the output of the (b) subtraction circuit, and, (d) means for causing the output of the square rooting circuit to reduce the amplitude of the quadrature carrier component.

12. The Armstrong modulator of claim 9 wherein the same means for reducing the amplitude of the quadrature carrier comprises;

(a) means for detecting the envelope amplitude of the combined quadrature carrier and the double-sideband suppressed carrier wave, and, (b) means for using the detected envelope amplitude to control the gain of a circuit so as to reduce only the quadrature carrier wave's amplitude as a function of (a) detection means.

13. An Armstrong type phase modulator comprising;

(a) means for producing a double-sideband suppressed carrier wave connected to an input signal source, and a carrier wave generator, (b) phase shifting means so connected as to cause a carrier wave sample to be essentially in quadrature with the phasor sum of the components of the double-sideband suppressed carrier wave, (c) means for controlling the amplitude of only said carrier wave sample as a function of said input signals so that the phasor sum of the controlled amplitude carrier wave and said double-sideband suppressed carrier wave has essentially a constant amplitude envelope, and (d) means for combining the output of (a) means and the output of (c) means.

14. A device for producing envelope modulated waves comprising;

means for generating two angular modulated waves relatively free of envelope modulation the sum of said waves is essentially a double-sideband suppressed carrier wave with a single upper and lower sideband component for every input signal spectral component, separate means for amplifying each of said two angular modulated waves, means for amplifying an unmodulated wave that has a frequency equal to the arithmetic means of said double-sideband suppressed carrier wave, and, means for combining the outputs of the three amplifying means to produce an envelope modulated wave.

15. An Armstrong type modulator suitable for use in hybrid modulation transmitters comprising;

(a) balanced modulator means whose signal port is connected to an input signal source and whose carrier port is connected to a source of angular modulated waves, (b) means for shifting the relative phase of a sample of the angular modulated waves and the output of the balanced modulator means by 90 degrees, (c) means for controlling the amplitude of the angular modulated wave sample as a function of the input signal so that the phasor sum of the quadrature related controlled amplitude angular modulated wave and the wave generated in said balanced modulator means has essentially a constant amplitude envelope, and, (d) means for combining the resulting two quadrature related waves.

16. An Armstrong type phase modulator incorporating a nonlinear circuit, which, when fed by a modulating signal produces a wave which only controls the amplitude of a carrier or reference angular modulated wave so that the sum of the carrier or reference wave and a double-sideband suppressed carrier or reference wave, generated by a balanced modulator whose signal input port is also fed by said modulating signal and whose suppressed carrier or reference wave is in quadrature with the said first carrier or reference wave is a substantially constant amplitude wave, said nonlinear circuit comprising a squaring means which squares the modulating signal voltage, a difference circuit connected to the output of the squaring means and which subtracts the output of the squaring means from a dc voltage, and a square root means which is connected to the output of the difference means.

* * * * *